United States Patent [19]

Feather

[11] Patent Number: 4,623,257

[45] Date of Patent: Nov. 18, 1986

[54] ALIGNMENT MARKS FOR FINE-LINE DEVICE FABRICATION

[75] Inventor: Mitchell D. Feather, Avenel, N.J.

[73] Assignee: AT&T Bell Laboratories, Murray Hill, N.J.

[21] Appl. No.: 687,125

[22] Filed: Dec. 28, 1984

[51] Int. Cl.⁴ .............................................. G01B 11/00
[52] U.S. Cl. ...................... 356/401; 356/400
[58] Field of Search ............................. 356/399–401

[56] References Cited

U.S. PATENT DOCUMENTS 3,990,798 11/1976 White .................................. 356/172
4,529,314 7/1985 Ports .................................. 356/401

*Primary Examiner*—R. A. Rosenberger
*Assistant Examiner*—Crystal D. Cooper
*Attorney, Agent, or Firm*—Lucian C. Canepa

[57] ABSTRACT

A high-precision alignment pattern for fine-line device fabrication comprises unique marks. The pattern is utilized to align a mask or reticle with respect to a wafer and/or to evaluate actual level-to-level registration achieved between a set of masks or reticles and a wafer. One mark of the pattern comprises two spaced-apart parallel lines. The other mark comprises a notch or arrow-head including an apex portion. In practice, the orientation between the apex portion and the associated parallel lines of the pattern can be read relatively easily with high accuracy.

8 Claims, 8 Drawing Figures

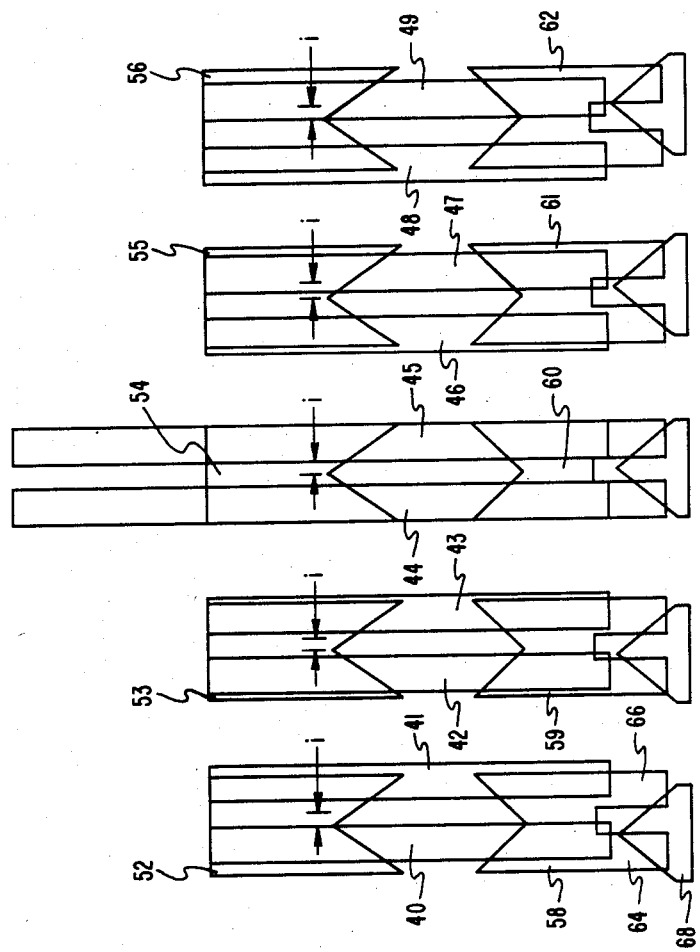

ALIGNMENT MARKS FOR FINE-LINE DEVICE FABRICATION

BACKGROUND OF THE INVENTION

This invention relates to the fabrication of microminiature devices such as fine-line semiconductor integrated-circuit devices and, more particularly, to achieving and/or evaluating alignment between lithographic masks or reticles and an associated wafer in which devices are formed.

A typical fabrication sequence for making integrated-circuit devices involves successively defining fine-line features on a resist-coated semiconductive wafer. For some fine-line devices, resolution down to or below the 1-micrometer ($\mu$m) level, with overlay accuracy from level to level of only about $\pm 0.125$ $\mu$m or better, is required. Each step of the fabrication sequence therefore requires accurate positioning of a mask or reticle with respect to the wafer, as is well known in the art.

Fiducial marks on the mask or reticle and on the wafer are typically utilized to establish alignment therebetween. Moreover, as a basis for evaluating critical level-to-level alignments that are actually achieved, a so-called vernier pattern is typically formed on the wafer. Examination of this pattern gives a visual indication of the actual alignment accuracy realized on the wafer between specified levels during the fabrication sequence.

Various types of marks have been successfully employed for alignment purposes in integrated-circuit device fabrication. As, however, the dimensions of these devices continue to decrease, the ability of a human operator to rapidly determine the relative orientation of standard alignment marks with sufficiently high precision becomes increasingly difficult.

Accordingly, efforts have been directed by workers in the integrated-circuit device art aimed at trying to devise improved alignment marks. It was recognized that such efforts, if successful, had the potential for decreasing the time required by an operator to achieve and/or to evaluate level-to-level alignment in a fine-line device fabrication sequence. In turn, this would lower the cost and improve the quality of devices made utilizing such marks.

SUMMARY OF THE INVENTION

Hence, an object of the present invention is to improve the manufacture of microminiature devices. More specifically, an object of this invention is an improved alignment mark pattern that facilitates the fabrication of high-quality integrated-circuit devices.

Briefly, these and other ojbects of the present invention are realized in a device fabrication sequence in which a specific illustrative pattern of unique alignment marks is utilized. Each pair of marks included in the pattern comprises two parallel lines and a notched or arrow-headed feature having an apex portion designed to be aligned with respect to the two parallel lines.

In accordance with one feature of the invention, the aforespecified alignment marks included in a pair of marks are formed on a mask (or reticle) and on an associated resist-coated wafer, respectively. The marks are then utilized to achieve alignment between the mask and wafer preparatory to lithographically transferring the mask pattern to the resist coating. In accordance with another feature of the invention, pairs of such marks are formed on the wafer to constitute a vernier design utilized to evaluate level-to-level registration that is actually achieved in fine-line device fabrication.

BRIEF DESCRIPTION OF THE DRAWING

A complete understanding of the present invention and of the above and other features and advantages thereof may be gained from a consideration of the following detailed description presented hereinbelow in connection with the accompanying drawing, in which:

FIG. 6 shows an X-direction vernier made in accordance with the principles of the present invention.

DETAILED DESCRIPTION

Figure 1:
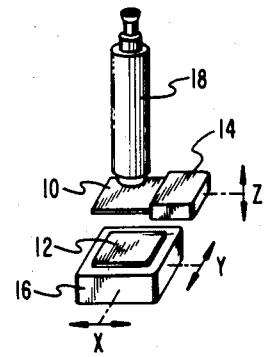
FIG. 1 is a schematic representation of one form of illustrative apparatus utilized to carry out a fabrication sequence in accordance with the principles of applicant's invention.

Conventional apparatus for aligning a patterned member 10 with respect to a resist-coated wafer 12 is schematically represented in FIG. 1. The member 10 is held by a standard carrier 14 that is designed to move the member in the depicted Z direction. The wafer 12 is mounted on a standard X-Y-movable table 16.

Illustratively, an operator aligns the member 10 with respect to the wafer 12 of FIG. 1 by utilizing a microscope 18. Advantageously, the microscope is of the bifocus type described in U.S. Pat. No. 3,990,798. With such a microscope, the operator can focus simultaneously on alignment marks respectively formed on the patterned member and on the wafer even though the member-to-wafer separation in the Z direction is greater than the depth-of-focus of the microscope 18.

Various forms and shapes of marks have been utilized heretofore for achieving alignment between a patterned member and a wafer preparatory to a standard pattern transfer step. For full-field transfer of the pattern to the entire area of the wafer, the member is typically known as a mask. For such transfer, several mating marks on each of the mask and wafer are sufficient to achieve registration therebetween.

For standard step-and-repeat transfer of a pattern to a wafer, a patterned member known as a reticle is employed. By way of example, the reticle constitutes a mask-like structure comprising a 5-to-1 enlarged version of the pattern to be transferred to each of multiple chip sites on the wafer. For such transfer, several marks on the reticle are designed to be aligned with several respectively corresponding marks in each chip site.

In the schematic depiction of FIG. 1, no instrumentality is explicitly shown for reducing the pattern contained on the member 10 before transferring it to the resist-coated wafer 12. Nevertheless, the FIG. 1 arrangement is to be understood herein as representing either a full-field or a step-and-repeat transfer system adapted for integrated-circuit device fabrication. Hence, the member 10 may be regarded as either a mask or a reticle.

Figure 2:
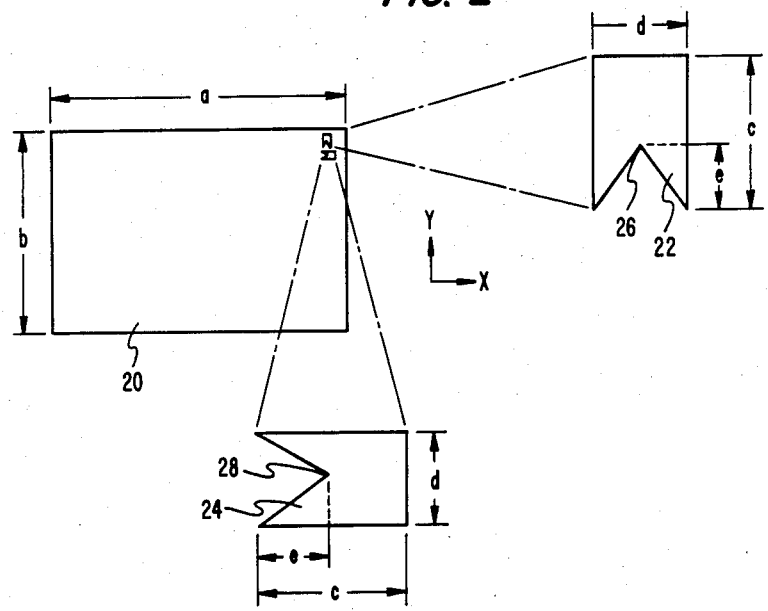
FIG. 2 shows a mask or reticle having thereon specific illustrative alignment marks made in accordance with applicant's inventive principles.

FIG. 2 depicts a mask member 20 having thereon alignment marks 22 and 24 made in accordance with the principles of the present invention. Illustratively, the member 20 comprises a standard glass plate having a patterned chromium film formed on the surface thereof. (Only the marks 22 and 24 of the overall mask pattern are explicitly shown in FIG. 2.) By way of example, each of the marks 22 and 24 comprises a clear (glass) area defined by selectively removing chromium from the member. Alternatively, each mark can comprise an opaque (chromium) region in a local clear area.

In accorance with one feature of applicant's invention, a mark having a notch defining an apex is aligned with respect to a mating mark that includes parallel lines. Applicant has found that such an arrangement of marks can in practice be rapidly aligned by an operator with high precision. In particular, the ability of the human eye to align an apex midway between two lines has been found to be remarkably accurate and relatively easy to achieve.

Each of the marks 22 and 24 shown in FIG. 2 includes a notch or indent that defines an apex. Thus, the mark 22 includes apex 26 and the mark 24 includes apex 28. The mark 22 is utilized for X-direction alignment whereas the mark 24 is utilized for Y-direction alignment, as will be evident later below.

In one specific illustrative embodiment of applicant's invention, the dimensions a and b of the mask member 20 shown in FIG. 2 are approximately 124 millimeter (mm) and 100 mm, respectively. In that particular embodiment, the dimensions c, d and e of each of the marks 22 and 24 are about 10 $\mu$m, 4 $\mu$m and 5 $\mu$m, respectively.

Figure 3:
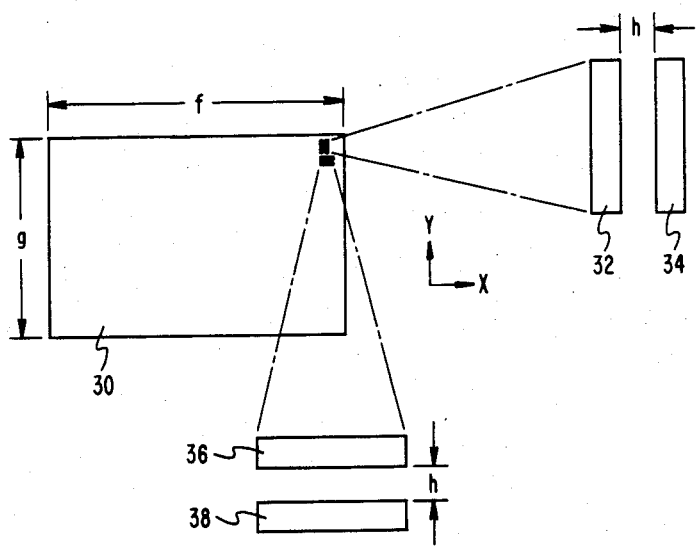
FIGS. 3 and 4 respectively depict wafers each having specific illustrative alignment marks designed to be employed with the particular marks shown in FIG. 2.

FIG. 3 shows a specific illustrative wafer member 30 that is intended to be aligned with respect to the mask member 20 of FIG. 2 to achieve full-field patterning of the member 30. By way of example, the member 30 comprises a flat piece of semiconductor material such as silicon having a layer of resist material over the entire top surface thereof. Interposed between the resist layer and the top surface of the silicon member are two pairs of alignment marks made in accordance with the principles of the present invention. Illustratively, the dimensions f and g of the member 30 are approximately 125 mm and 100 mm, respectively.

One pair of the alignment marks shown in FIG. 3 comprises parallel lines 32 and 34, whereas the other pair comprises parallel lines 36 and 38. The lines 32 and 34 are designed to mate with the mark 22 of FIG. 2, whereas the lines 36 and 38 are designed to mate with the mask 24 of FIG. 2. Illustratively, each of the lines 32, 34, 36 and 38 comprises a conventionally patterned element made of silicon dioxide. In one particular embodiment, each of the depicted lines is about 1.0 $\mu$m thick in the Z direction, each line measures approximately 1.5 $\mu$m wide by 15 $\mu$m high and the distance h between the lines of each pair is about 1.0 $\mu$m.

The member 20 represented in FIG. 2 can also be considered to be a reticle adapted to be utilized in standard step-and-repeat lithography. In that case, each chip site on an associated wafer includes alignment marks designed to mate with the marks 22 and 24 of FIG. 2. Three such illustrative chip sites, each with a pair of alignment marks formed therein, are depicted in FIG. 4 by dash lines.

Figure 4:
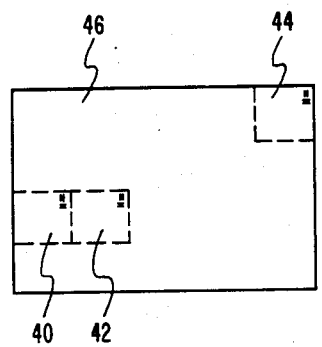

More specifically, FIG. 4 shows three chip sites 40, 42 and 44 on resist-coated wafer 46. Each site includes two pairs of the aforedescribed parallel lines employed as alignment marks. The marks 22 and 24 on the reticle 20 (FIG. 2) are each designed to mate in sequence with the respective lines of a pair in each chip site, including the sites 40, 42 and 44, on the wafer 46 during standard step-and-repeat lihtography.

Figure 5:
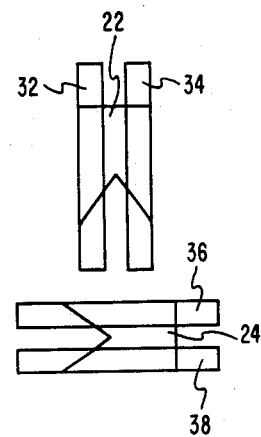
FIG. 5 represents the marks of FIGS. 2 superimposed upon and aligned with respect to the marks of FIG. 3 or FIG. 4.

FIG. 5 shows a top view of mating alignment marks of the type made in accordance with the principles of the present invention. By way of example, FIG. 5 shows the mark 22 (FIG. 2) superimposed upon and aligned with the associated pair of lines 32 and 34 (FIG. 3). Also, FIG. 5 shows the mark 24 (FIG. 2) superimposed upon and aligned with the associated pair of lines 36 and 38 (FIG. 3).

The marks 22, 32 and 34 of FIG. 5 constitute an effective instrumentality for achieving X-direction alignment between two associated members on which the mark 22 and the marks 32, 34 are respectively formed. Similarly, the marks 24 and 36, 38 serve as an effective basis for Y-direction alignment of two members such as a mask (or reticle) and an associated wafer.

In practice, applicant has found that an operator is easily able to centrally position the apex of the mark 22 (FIG. 5) between the parallel marks 32 and 34 with relatively high precision. X-movement of the apex from an aligned central position between the marks 32 and 34 is easily discernible. Similarly, an operator can easily centrally position the apex of the mark 24 between the parallel marks 36 and 38 with high precision. Y-movement of the apex from an aligned central position between the marks 36 and 38 is easily discernible.

Once alignment is reached between a mask or reticle member and a wafer member, it is often important in practice to establish marks on the wafer indicative of the alignment that was actually achieved between the members. Advantageously, such marks, constituting an easily readable vernier, are made in accordance with the principles of the present invention, as specified below.

FIG. 6 shows an X-direction vernier composed of multiple ones of applicant's inventive marks defined on a wafer. Constituent marks of the depicted vernier are formed on the wafer during successive steps of a multi-level device fabrication sequence. The registration of each level of the sequence is therefore in effect represented on the wafer by a corresponding level of marks.

Thus, for example, parallel marks 40 through 49 shown in FIG. 6 are simultaneously formed on a wafer at a specified level (designated level No. 1) of the device structure being fabricated on the wafer. These marks, which are derived from corresponding marks defined on an associated mask or reticle, are made of the particular material that is being patterned at the specified level.

During a subsequent pattern transfer step at another level (level No. 2), additional features derived from a mask or reticle are defined on the wafer. These additional features include notched marks 52 through 56 (FIG. 6). The marks 52 through 56 are superimposed upon respective pairs of the parallel marks 40 through 49 and constitute a representation of the alignment actually achieved in the device structure between the aforementioned specified and subsequent levels. Inspection by an operator of the marks 40 through 49 and 52 through 56 provides an easily readable indication of that relative alignment.

In the particular vernier design shown in FIG. 6, the center mark 54 representative of fabrication level No. 2 is shown as being ideally aligned with respect to the associated pair of parallel marks 44 and 45 representative of level No. 1. In that case, the other marks 52, 53, 55 and 56 representative of level No. 2 are formed purposely progressively offset with respect to their respective associated pairs of parallel marks representative of level No. 1. More specifically, the marks 55 and 56 are progressively offset to the right with respect to their respective associated pairs of marks, and the marks 53 and 52 are progressively offset to the left with respect to their respective associated pairs of marks.

For other than the ideal level No. 1-to-level No. 2 alignment represented in FIG. 6, the marks 52 through 56 will be displaced as a group with respect to the parallel marks 40 through 49. For each such displacement, the positions of the respective apexes of the marks 52 through 56 in the gaps between the associated parallel marks are readily apparent. Thus, for example, displacement to the right of the entire group of marks 52 through 56 each by a distance i will cause only the mark 52 to appear to be exactly aligned with respect to its associated pair of marks. Each of the other marks 53 through 56 will be displaced to the right with respect to its associated pair of parallel marks. This would clearly and unequivocally indicate that a level-to-level misalignment had occurred during fabrication. By means of applicant's unique marks, the amount and direction of the misalignment is quickly discernible. Suitable adjustments can then be made in the fabrication sequence to achieve better level-to-level alignment in subsequent pattern transfer steps.

Other marks representative of the relative alignment of other levels are shown in FIG. 6. Thus, for example, marks 58 though 62 derived from level No. 3 of the fabrication sequence are depicted superimposed on the previously described marks 40 through 49 representative of level No. 1. By means of these marks, the registration actually achieved during device fabrication between levels 1 and 3 can therefore be evaluated.

Each of the marks 58 through 62 shown in FIG. 6 includes an apex designed to be associated with and easily located with respect to a respective pair of the parallel marks 40 through 49. Additionally, each of the marks 58 through 62 includes a pair of spaced-apart legs that serve as parallel marks designed to be associated with the apex of yet another mark. Thus, for example, the mark 58 includes a pair of spaced-apart legs 64 and 66. Those legs serve as reference marks for associated mark 68 which is derived from and thus representative of level No. 4. Accordingly, the mark 68 and the legs 64 and 66 serve as constituents of a set of depicted marks for evaluating the registration actually achieved during fabrication between levels 3 and 4.

In accordance with the principles of the present invention, the mark 68 and other similar marks shown in FIG. 6 each include an arrow-head feature. Such a feature also provides an apex for easy visual location with respect to associated parallel marks.

So as not to unduly complicate the drawing, FIG. 6 represents only an X-direction vernier made in accordance with the principles of the present invention. Typically, a suitable Y-direction vernier would also be formed on the wafer during the fabrication sequence. Illustratively, such a Y-direction vernier would appear on the wafer exactly as represented in FIG. 6 but rotated therefrom by 90 degrees. The two verniers are typically built up layer by layer on the wafer directly adjacent to each other during successive steps of a multi-level fabrication sequence. For full-field lithography, at least two sets of verniers, each set including an X vernier and a Y vernier, are usually required on the wafer for effective alignment evaluation purposes. For step-and-repeat lithography, at least one set of verniers, each including an X vernier and a Y vernier, is required per chip site on the wafer.

Figure 7:
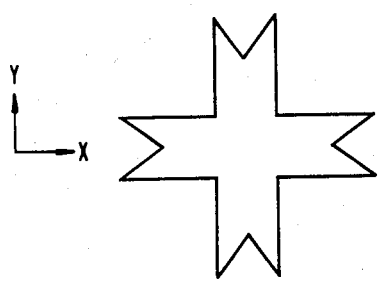
FIGS. 7 and 8 each depict composite alignment marks made in accordance with applicant's invention.
Figure 8:
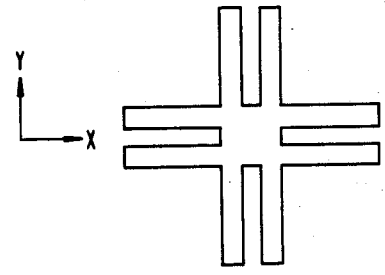

Composite marks made in accordance with the principles of the present invention are also advantageous for establishing and/or evaluating alignment. Two illustrative such marks are shown in FIGS. 7 and 8, respectively. By superimposing the FIG. 7 mark over the FIG. 8 one, both X- and Y-direction alignment indications are provided in a single pair of small-area marks. Thus, the indicated marks are well suited for respective inclusion on masks (or reticles) and associated wafers. Additionally, a compact vernier for X- and Y-direction evaluation can be formed on a wafer by combining associated pairs of composite marks of the type shown in FIGS. 7 and 8.

Finally, it is to be understood that the above-described structures and techniques are only illustrative of the principles of the present invention. In accordance with these principles, numerous modifications and alternatives may be devised by those skilled in the art without departing from the spirit and scope of the invention. For example, although the primary emphasis herein has been directed to utilizing applicant's inventive marks in connection with the fabrication of integrated-circuit devices, it is to be understood that these marks are also applicable to a variety of other commercial applications in which alignment between associated members is to be established and/or evaluated.

What is claimed is:

1. A method of establishing and/or evaluating alignment in an integrated-circuit device fabrication sequence, said method comprising the steps of
    viewing in a superimposed manner an alignment mark comprising an apex and an alignment mark comprising two spaced-apart parallel rectangles,
    and detecting the deviation if any between the apex and a mid-point between said rectangles by directly viewing the position of said apex with respect to said rectangles.

2. A method as in claim 1 wherein one of said marks is formed on a mask or reticle member and the other of said marks is formed on a wafer member, and wherein, upon detection of any deviation, said members are moved relative to each other to minimize said deviation.

3. A method as in claim 1 wherein said marks are formed on a wafer during successive steps of a multi-level fabrication sequence to constitute an indication of the relative alignment actually achieved, between said wafer and associated sets of masks or reticles.

4. A method comprising the steps of
    defining marks in first and second associated members to constitute related pairs of marks designed to be superimposed upon each other, each such pair of marks comprising a mark including two spaced-apart paralllel rectangles and a mark including an apex portion,
    and detecting the deviation if any of the apex portion of a mark form a mid-point between the parallel rectangles of a related mark of a pair by directly viewing the position of said apex with respect to said rectangles.

5. A method as in claim 4 wherein the method is directed to fabricating microminiature devices and wherein said first member comprises a mask member and said second member comprises a wafer member, wherein one mark of each pair of marks is formed in said mask member and the other related mark of each pair is formed on said wafer member, and wherein said method involves positioning said members to locate the apex portion of one mark of an X-direction pair at a mid-point between the parallel rectangles of the other mark of the related X-direction pair and to locate the apex portion of one mark of a Y-direction pair at a mid-point between the parallel lines of the other mark of the related Y-direction pair, thereby to establish X-Y alignment between said members.

6. A method as in claim 4 wherein said first member comprises a reticle member and said second member comprises a wafer member, wherein one mark of each pair of marks is formed on said reticle member and the other related mark of each pair is formed at each of multiple chip sites on said wafer member, and wherein said method involves successively positioning said members in a step-and-repeat mode to locate the apex portion of one mark of and X-direction pair at a midpont between the parallel rectangles of the other mark of the related X-direction pair at each chip site and to locate the apex portion of one mark of a Y-direction pair at a mid-point between the parallel rectangles of the other mark of the related Y-direction pair at each chip site, thereby to successively establish X-Y alignment between said reticle member and said respective chip sites.

7. A method as in claim 4 wherein said first member comprises a mask member and said second member comprises a wafer member, and wherein marks defined on multiple mask members successively associated with said wafer member in a multi-level fabrication sequence are transferred to said wafer member to form superimposed marks in a layered vernier structure representative of the actual mask member-to-wafer member alignments achieved during said fabrication sequence.

8. A method as in claim 4 wherein said first member comprises a reticle member and said second member comprises a wafer member, and wherein marks defined on multiple reticle members successively associated with said wafer member in a step-and-repeat mode in a multi-level fabrication sequence are transferred to each chip site on said wafer member to form superimposed marks in a layered vernier structure representative of the actual reticle member-to-chip site alignments achieved during said fabrication sequence.

* * * * *